(12) United States Patent
Hess et al.

(10) Patent No.: US 7,632,715 B2
(45) Date of Patent: Dec. 15, 2009

(54) METHOD OF PACKAGING SEMICONDUCTOR DEVICES

(75) Inventors: Kevin J. Hess, St. Ismier (FR); Chu-Chung Lee, Round Rock, TX (US); Robert J. Wenzel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 10 days.

(21) Appl. No.: 11/620,074

(22) Filed: Jan. 5, 2007

(65) Prior Publication Data
US 2008/0164593 A1 Jul. 10, 2008

(51) Int. Cl.
*H01L 21/00* (2006.01)
(52) U.S. Cl. ............... 438/120; 438/118; 438/127; 438/106; 257/682; 257/758; 257/E23.135; 257/E21.598
(58) Field of Classification Search ........... 257/783, 257/782, 789, 795, 723, 724; 438/118–127
See application file for complete search history.

(56) References Cited

U.S. PATENT DOCUMENTS

| | | | | |
|---|---|---|---|---|
| 5,637,669 A | * | 6/1997 | Hefner et al. | 528/97 |
| 5,841,193 A | * | 11/1998 | Eichelberger | 257/723 |
| 6,373,142 B1 | * | 4/2002 | Hoang | 257/783 |
| 2002/0056906 A1 | | 5/2002 | Kajiwara et al. | |
| 2002/0105093 A1 | * | 8/2002 | Papathomas | 257/778 |
| 2004/0191962 A1 | | 9/2004 | Jiang et al. | |
| 2004/0214377 A1 | | 10/2004 | Starkovich et al. | |
| 2005/0242425 A1 | * | 11/2005 | Leal et al. | 257/690 |
| 2005/0287355 A1 | | 12/2005 | Matayabas, Jr. | |
| 2006/0147719 A1 | | 7/2006 | Rubinztajn et al. | |
| 2006/0192301 A1 | | 8/2006 | Leal et al. | |
| 2006/0246627 A1 | * | 11/2006 | Feustel et al. | 438/118 |

FOREIGN PATENT DOCUMENTS

EP 1473769 A2 11/2004

OTHER PUBLICATIONS

PCT Search report and Written Opinion for corresponding PCT Application No. PCT/US07/88282 mailed May 22, 2008.

* cited by examiner

*Primary Examiner*—N Drew Richards
*Assistant Examiner*—Mamadou Diallo
(74) *Attorney, Agent, or Firm*—James L. Clingan, Jr.; Robert L. King

(57) ABSTRACT

A method of packaging a semiconductor includes providing a support structure. An adhesive layer is formed overlying the support structure and is in contact with the support structure. A plurality of semiconductor die is placed on the adhesive layer. The semiconductor die are laterally separated from each other and have electrical contacts that are in contact with the adhesive layer. A layer of encapsulating material is formed overlying and between the plurality of semiconductor die and has a distribution of filler material. A concentration of the filler material is increased in all areas laterally adjacent each of the plurality of semiconductor die.

18 Claims, 5 Drawing Sheets

US 7,632,715 B2

METHOD OF PACKAGING SEMICONDUCTOR DEVICES

FIELD OF THE INVENTION

This invention relates generally to semiconductor devices, and more specifically, to packaging semiconductor devices with an encapsulant.

BACKGROUND

Typically, devices are packaged for protection during operation. These packaged devices are placed on a printed circuit board (PCB) with other devices. The PCB with the devices is used in products, such as computers or cellular phones. Since there is a desire to decrease the size of products, such as computers and cellular phones, there is a need to decrease the size of the PCB and the package device without sacrificing functionality. One effective technique that has been developed is to provide an adhesive tape on a support base, place singulated semiconductor devices on the adhesive tape, apply an encapsulant over the semiconductor devices, turn the semiconductor devices over, separate the semiconductor devices from the adhesive layer, form interconnect layers to provide external contacts in a particular arrangement, and then singulate to achieve packaged semiconductor devices. Solder balls can be formed to the external contacts of the packaged semiconductor devices. This approach, as do others, benefit from improvements in manufacturing yield and reliability. Accordingly, there is a need for improving yield and/or reliability.

BRIEF DESCRIPTION OF THE DRAWINGS

The present invention is illustrated by way of example and is not limited by the accompanying figures, in which like references indicate similar elements. Skilled artisans appreciate that elements in the figures are illustrated for simplicity and clarity and have not necessarily been drawn to scale.

DETAILED DESCRIPTION OF THE DRAWINGS

Figure 1:
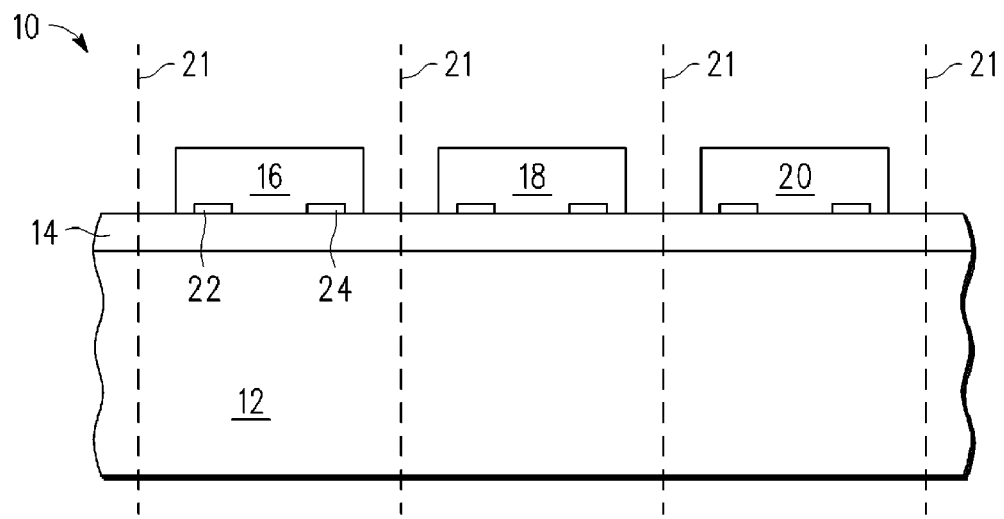
FIG. 1 is a cross-section of a workpiece having a plurality of semiconductor devices at a stage in processing according to one embodiment.

In one aspect the context is to provide an adhesive tape on a support base, place singulated semiconductor devices on the adhesive tape, apply an encapsulant over the semiconductor devices, turn the semiconductor devices over, separate the semiconductor devices from the adhesive layer, form interconnect layers to provide external contacts in a particular arrangement, and then singulate to achieve packaged semiconductor devices. After applying the encapsulant, which has an initial concentration of filler, the filler concentration is increased near the semiconductor devices. This is beneficial because it causes a reduction in the amount of movement and the amount of variation in movement of the semiconductor devices in the subsequent processing. This is better understood by reference to the drawings and the following description Shown in FIG. 1 is a workpiece 10 comprising a base 12, an adhesive layer 14 on base 12, a semiconductor device 16 over adhesive layer 14, a semiconductor device 18 over adhesive layer 14, a semiconductor device 20 over adhesive layer 14. Adhesive layer 14 has one major surface adhering to the base and another major surface for adhering semiconductor devices 16, 18, and 20. External contacts of semiconductor devices 16, 18, and 20 are on the surfaces of their respective semiconductor devices 16, 18, and 20 that are in contact with adhesive layer 14. Semiconductor device 16 is shown having contacts 22 and 24. Semiconductor devices such as semiconductor devices 16, 18, and 20 have many more than the two shown. It is not unusual for such semiconductor devices to have external contacts in the hundreds. Base 12 is for supporting semiconductor devices 16, 18, and 20 during processing. Also shown, by dotted lines 21, is a singulation boundary that defines a singulation area. This shows where workpiece 10 will be separated into packaged semiconductor devices that may be the same or different from other packaged semiconductor devices.

Figure 2:
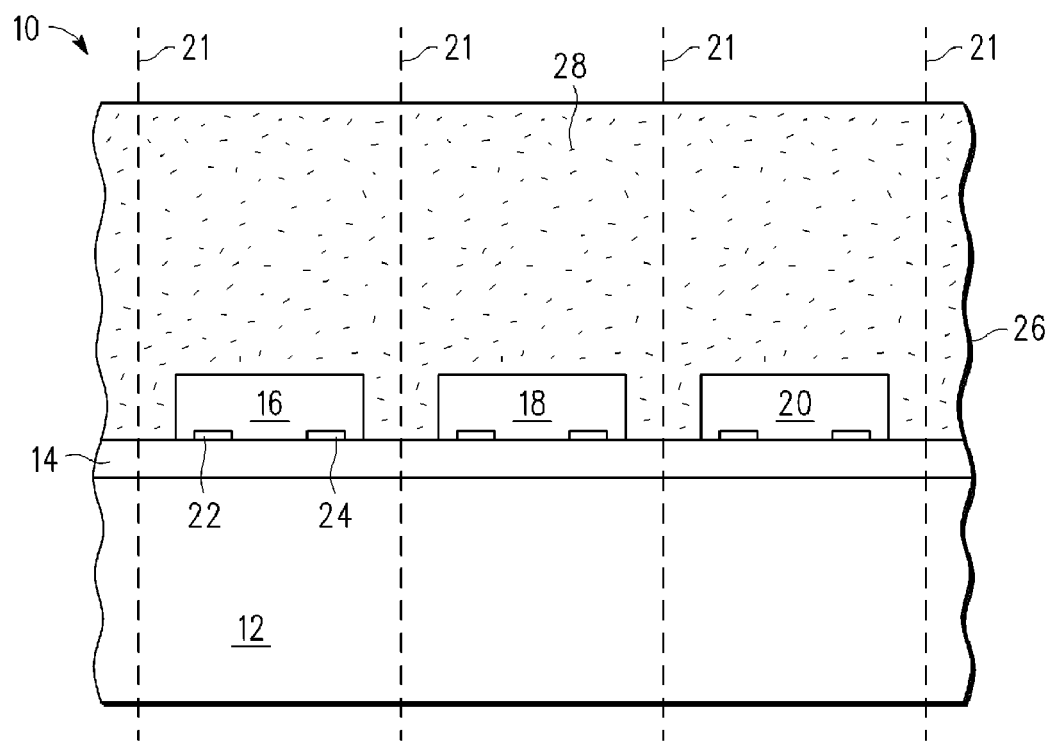
FIG. 2 is a cross-section of the workpiece of FIG. 1 at a subsequent stage in processing.

Shown in FIG. 2 is workpiece 10 after depositing an encapsulant 26 that comprises primarily filler and resin. This is preferably a glob-top type resin so that molding, which typically uses high pressures and expensive tooling, is not required. The filler is comprised of small particles. These particles are typically of silicon oxide. The resin is useful in suspending the filler. An exemplary filler particle is shown as particle 28 in FIG. 2. A typical concentration of filler is 70% by weight. Concentrations that are given are by weight unless specifically stated otherwise. The filler concentration affects the encapsulant's coefficient of thermal expansion (CTE), which is preferably close to that of the semiconductor devices and affects the encapsulant's viscosity, which is preferably low. Low viscosity aids in the deposition of the encapsulant by providing better coverage, more uniform thickness, and reduced voiding. Viscosity is reduced by reducing the filler concentration. Bringing the coefficient of expansion of encapsulant closer to silicon, which is what is typically used for making semiconductor devices, is achieved by increasing the filler concentration. Thus to improve one causes a degradation in the other. Thus, there is a tradeoff in choosing the filler concentration. Further, the amount of shrinkage in curing encapsulant 26 is greater for lower concentrations of filler. Greater amounts of shrinkage cause the location of semiconductor devices 16, 18, and 20 to move more with respect to a center of workpiece 10. If such movement were perfectly repeatable, then it could be taken into account in the original placement of the semiconductor devices. The movement, however, varies from workpiece to workpiece and also for different locations along a given radius from the center of the workpiece. These variations are based on a variety of reasons. Examples include different thicknesses of encapsulant such as encapsulant 26, different compositions of encapsulant, different distributions of compositions in a given encapsulant layer, different heat distributions during curing, how well the semiconductor devices were placed on adhesive layer 14, and variations in adhesive layer 14.

Figure 3:
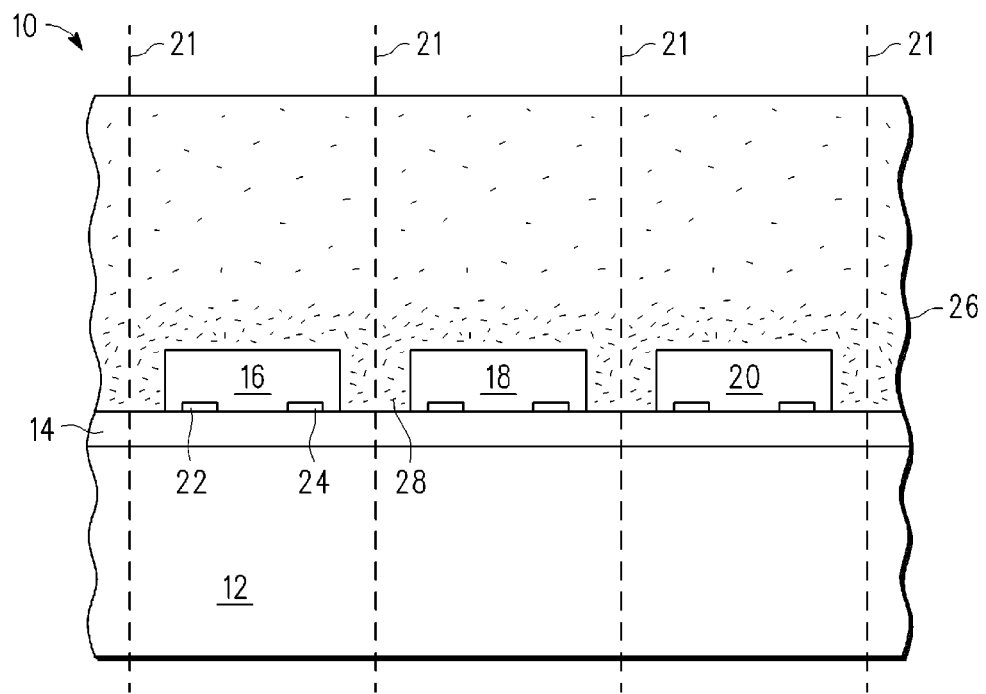
FIG. 3 is a cross-section of the workpiece of FIG. 2 at a subsequent stage in processing.

Shown in FIG. 3 is workpiece 10 after performing a process of increasing the concentration of filler near semiconductor devices 16, 18, and 20. This process preferably brings the concentration of filler to 85% or even greater near semiconductor devices 16, 18, and 20. Thus, at least in the regions between semiconductor devices 16, 18, and 20 and below their top surfaces, the average concentration is at least 85%. A process chosen may result in a concentration gradient of increasing filler concentration from the top surface to the bottom surface, which is the surface closest to adhesive layer 14 which in this case is the surface with external contacts exposed. One process for achieving this increased filler concentration near semiconductor devices 16, 18, and 20 is to place workpiece 10 under vacuum sufficient to cause vapor formation in encapsulant 26. The vapor moves to the top surface and apparently brings resin in that direction. Under this theory, the resin displaces the filler particles which are then driven downward by the displacement. Filler thus tends to be driven closer to semiconductor devices 16, 18, and 20 increasing filler concentration near semiconductor devices 16, 18, and 20.

Another approach for increasing filler concentration near semiconductor devices 16, 18, and 20 is to use centrifuging. A centrifuge, for example, can be adapted to apply a relatively stronger downward force on the filler. Another technique is to given it enough time so that gravity will have its affect of causing the particles to tend to collect on or near the bottom. This is the same principle as centrifuging but slower. In a case where the filler can be charged, by ionization for example, an electric field can be applied to bring the filler downward to increase filler concentration near semiconductor devices 16, 18, and 20. The ionization could be temporarily induced by radiation. While temporarily ionized, the applied electric field would apply a force in the desired direction. In a case where the filler can be a magnetic material, then a magnetic field can be applied to increase filler concentration near semiconductor devices 16, 18, and 20. Yet another approach is to apply vibrational energy. These techniques may be used separately or it may be useful to use two or more in conjunction.

Figure 4:
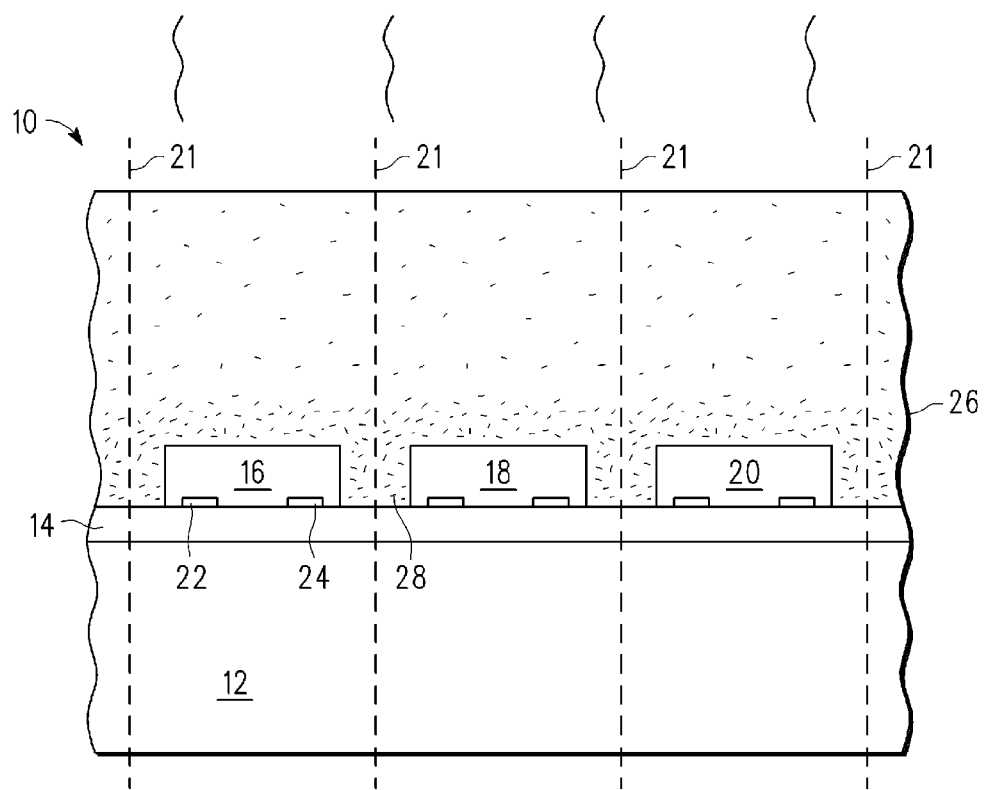
FIG. 4 is a cross-section of the workpiece of FIG. 3 at a subsequent stage in processing.

Shown in FIG. 4 is workpiece 10 during curing. Curing is achieved by applying heat with typical encapsulants. A typical curing process is applying heat in an oven. The time and temperature of the process for curing will depend on the particular encapsulant chosen. Encapsulant 26 in this described example is an epoxy based polymer with a concentration of 70% filler. Another technique for curing is by applying radiation, especially microwave. The effect of curing on semiconductor devices 16, 18, and 20 with a concentration of at least 85% filler in the regions between semiconductor devices 16, 18, and 20 is that there is less movement of semiconductor devices 16, 18, and 20 than with an encapsulant with a lower concentration of filler, especially the more typical concentration of 70%. This movement is also called drift. With less total movement, there is also less difference in drift from workpiece to workpiece and also less difference in drift for semiconductor device to semiconductor device on the same radius. With less variability, the original placement of semiconductor devices can better take into account the drift that does occur.

Figure 5:
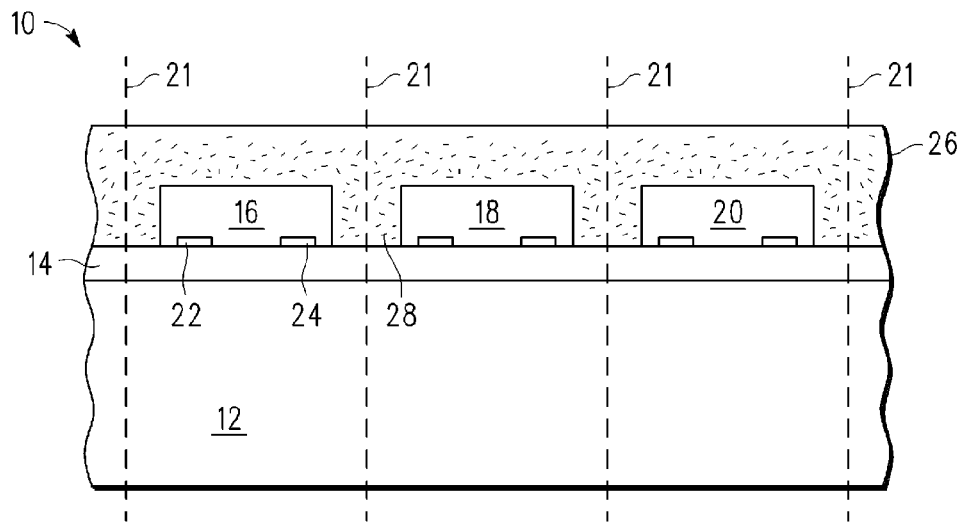
FIG. 5 is a cross-section of the workpiece of FIG. 4 at a subsequent stage in processing.

Shown in FIG. 5 is workpiece 10 after removing a top portion of encapsulant 26. In this example, there is a portion of encapsulant 26 over semiconductor devices 16, 18, and 20 remaining. An alternative is to remove encapsulant until the top surfaces of semiconductor devices 16, 18, and 20 are exposed.

Figure 6:
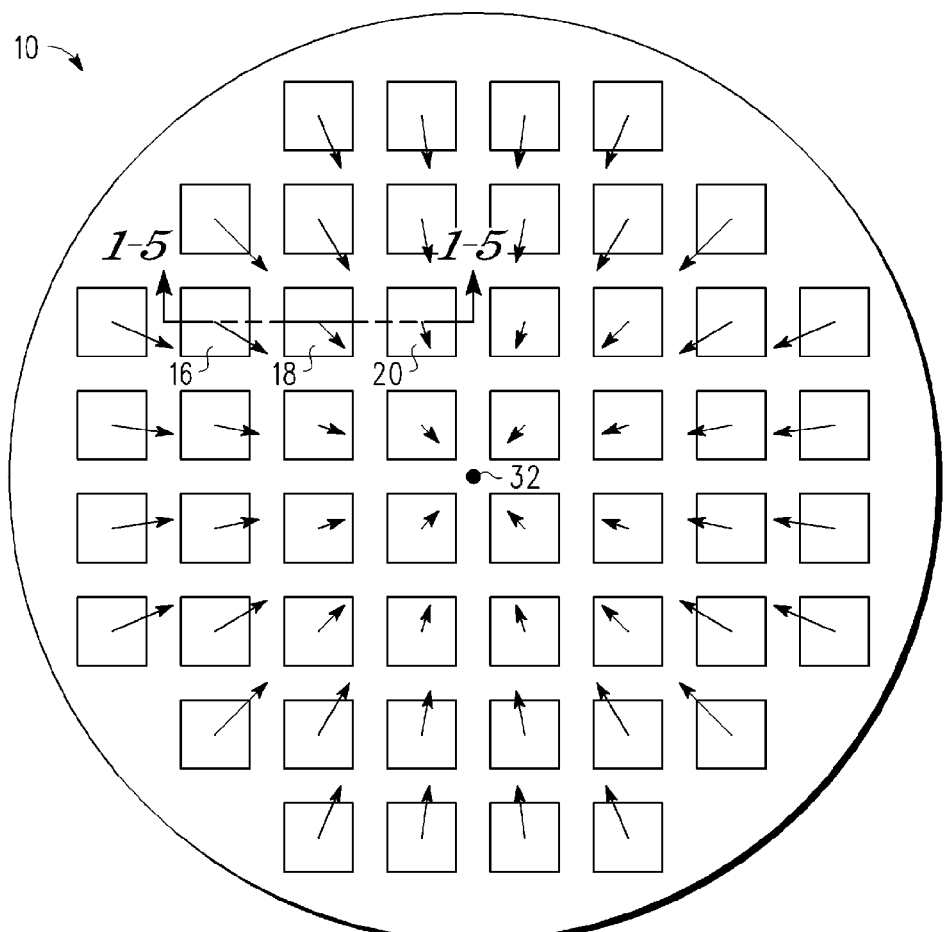
FIG. 6 is a top view of the workpiece of FIG. 5.

Shown in FIG. 6 is workpiece 10 from a top view. This shows a center 32 of workpiece 10 and a drift of semiconductor device 18 toward center 32 as a result of the cure. This is the drift that is reduced by increasing filler concentration near semiconductor devices 16, 18, and 20. Also this shows that semiconductor devices 16, 18, and 20 are not on the same radius. This also shows that drift increases with radius. The predictability of the movement is improved and thus placement is improved. Visually the movement is small but it increases with increase in radius from the center. The predictability allows for an original placement that properly compensates for the drift.

Figure 7:
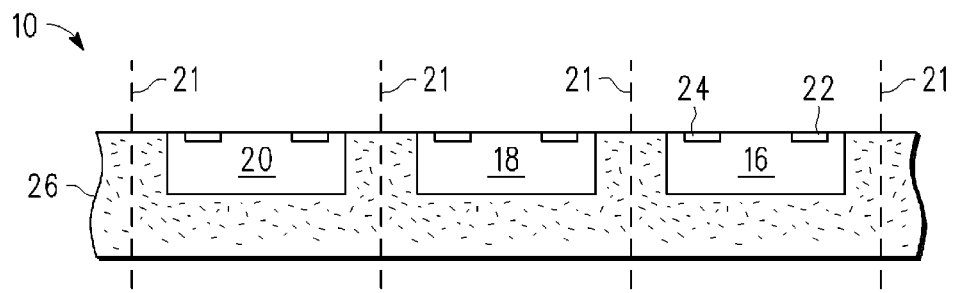
FIG. 7 is a cross-section of the workpiece of FIG. 5 at a subsequent stage in processing.

Shown in FIG. 7 is workpiece 10 after removing adhesive layer 14 so that external contacts of semiconductor devices 16, 18, and 20, such as contacts 22 and 24, are exposed. This also shows a rotation of workpiece 10

Figure 8:
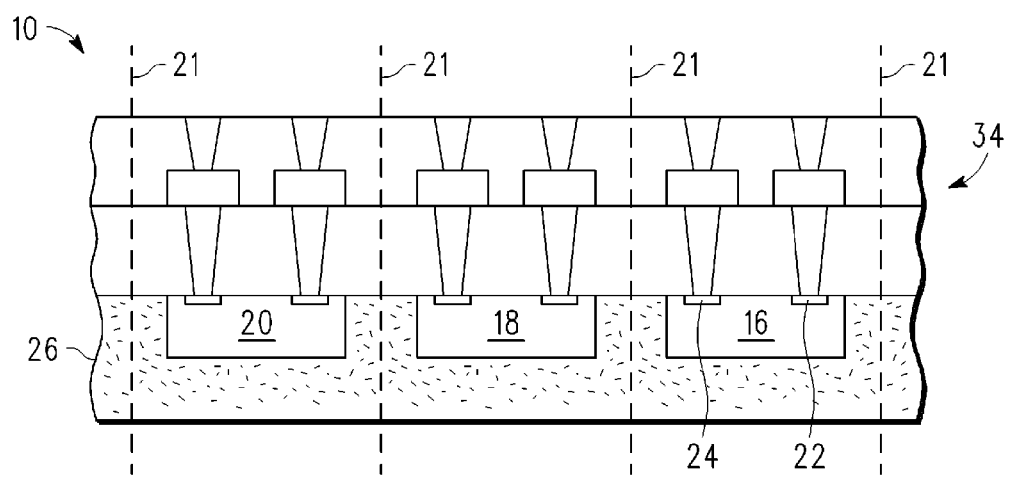
FIG. 8 is a cross-section of the workpiece of FIG. 7 at a subsequent stage in processing.

Shown in FIG. 8 is workpiece 10 after forming an interconnect 34 that is formed over the surfaces of semiconductor devices 16, 18, and 20 that have the exposed contacts.

Figure 9:
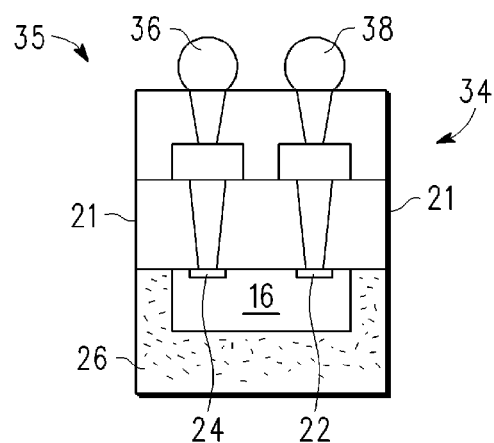
FIG. 9 is a cross-section of the workpiece of FIG. 8 at a subsequent stage in processing.

Shown in FIG. 9 is a packaged semiconductor device 35 after singulation of semiconductor device 16 from workpiece 10 and the formation of solder balls 36 and 38 on exposed metal contacts of packaged semiconductor device 35.

Figure 10:
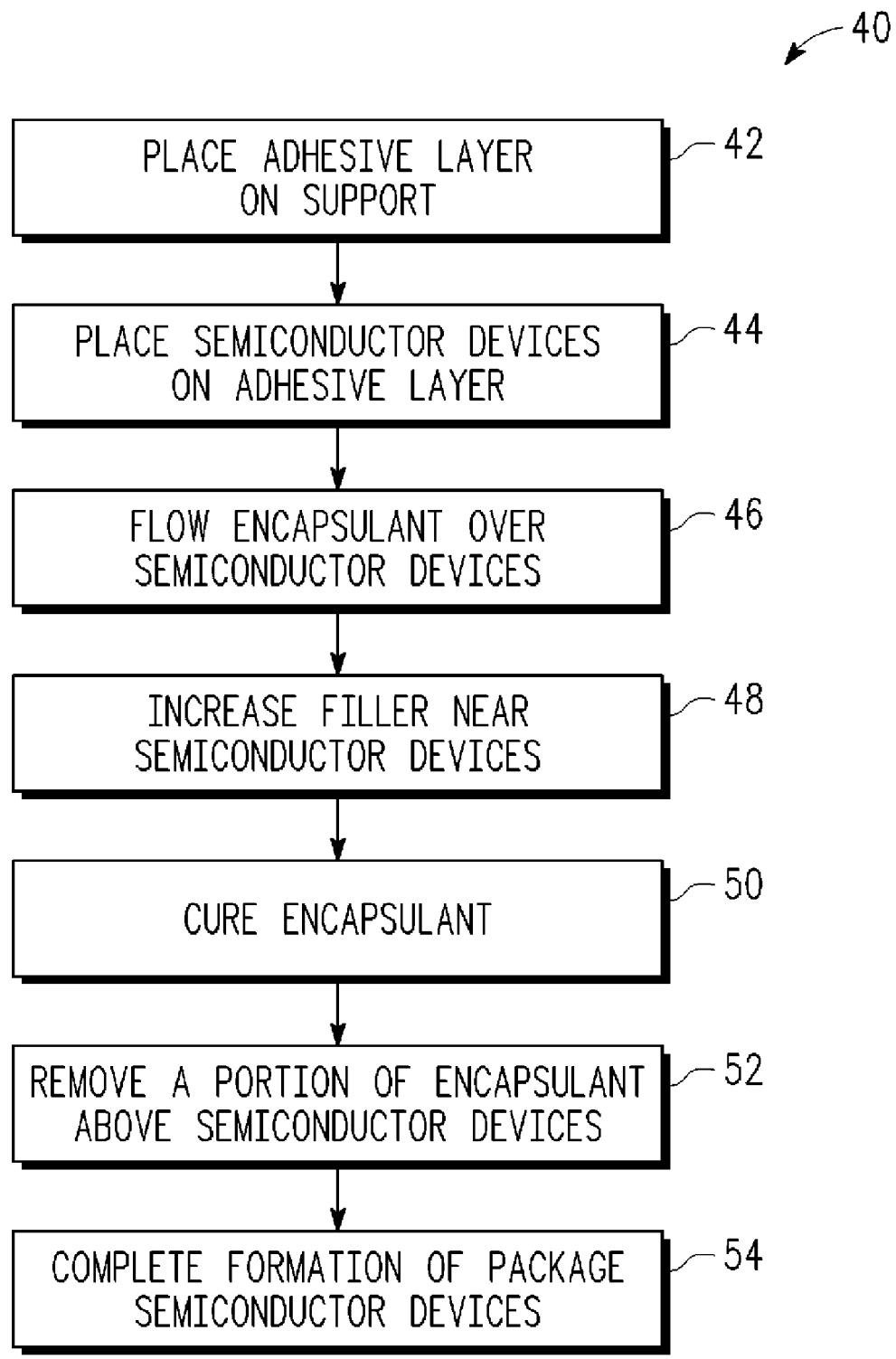
FIG. 10 is a block diagram of a method that includes the method for the embodiment of FIGS. 1-9.

Shown in FIG. 10 is a flow diagram 40 comprising steps 42, 44, 46, 48, 50, 52, and 54. Step 42 is placing adhesive layer 14 on base 12. Step 44 is placing semiconductor devices 16, 18, and 20 on adhesive layer 14. Step 46 is flowing encapsulant 26 over semiconductor devices 16, 18, and 20. Step 48 is increasing the filler concentration in encapsulant 26 near semiconductor devices 16, 18, and 20. Step 50 is curing encapsulant 26. Step 52 is removing a portion of the encapsulant 26 above semiconductor devices 16, 18, and 20. Step 54 is completing formation of packaged semiconductor devices such as packaged semiconductor device 35.

In the foregoing specification, the invention has been described with reference to specific embodiments. However, one of ordinary skill in the art appreciates that various modifications and changes can be made without departing from the scope of the present invention as set forth in the claims below. For example, there were specific examples described for increasing filler concentration near the semiconductor devices, but another technique may be found to be effective. Specific examples of curing were described but another type of curing may be used. Further, packaged semiconductor devices were shown as containing only a single semiconductor device, but more than one semiconductor device or other device type may be packaged in the same packaged semiconductor device. Accordingly, the specification and figures are to be regarded in an illustrative rather than a restrictive sense, and all such modifications are intended to be included within the scope of the present invention.

Benefits, advantages, solutions to problems, and any element(s) that may cause any benefit, advantage, or solution to occur or become more pronounced are not to be construed as a critical, required, or essential feature or element of any or all the claims. The terms "a" or "an", as used herein, are defined as one or more than one even if other elements are clearly stated as being one or more in the claims or specification. The term "plurality", as used herein, is defined as two or more than two. The term another, as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method comprising:
   providing a support structure (12);
   forming an adhesive layer (14) overlying the support structure, the adhesive layer having a first adhesive surface in contact with the support structure and an opposite second adhesive surface;
   placing a plurality of semiconductor die (16-20) on the second adhesive surface of the adhesive layer, the plurality of semiconductor die being laterally separated from each other and having electrical contacts (22, 24) that are in contact with the second adhesive surface of the adhesive layer;
   forming a layer of encapsulating material (26) overlying and between the plurality of semiconductor die, the layer of encapsulating material having a distribution of filler material (28), a top portion, and a bottom portion;
   increasing a concentration of the filler material (28) in all areas laterally adjacent each of the plurality of semiconductor die so that the bottom portion has a higher concentration of filler material than the top portion; and
   removing the top portion.

2. The method of claim 1 further comprising:
   also increasing concentration of the filler material in portions of the layer of encapsulating material overlying the plurality of semiconductor die that are in close proximity to the plurality of semiconductor die.

3. The method of claim 1 further comprising:
   increasing the concentration of the filler material by applying vibrational energy to the support structure, adhesive layer, plurality of semiconductor die and layer of encapsulating material.

4. The method of claim 3 further comprising:
   increasing the concentration of the filler material by applying ultrasonic energy as the vibrational energy.

5. The method of claim 1 further comprising:
   increasing the concentration of filler material by aligning the support structure to be below the adhesive layer, plurality of semiconductor die and layer of encapsulating material to permit gravity to modify the filler material concentration.

6. The method of claim 1 further comprising:
   increasing the concentration of filler material by placing the support structure, adhesive layer, plurality of semiconductor die and layer of encapsulating material in a vacuum to modify the filler material concentration.

7. The method of claim 1 further comprising:
   increasing the concentration of filler material by applying centrifugal energy to the support structure, adhesive layer, plurality of semiconductor die and layer of encapsulating material.

8. The method of claim 1 further comprising:
   increasing the concentration of filler material by using a magnetic or charged filler material influenced by a magnetic or electric field.

9. The method of claim 1 wherein the layer of encapsulating material comprises a glob-type resin, the method further comprising:
   curing the encapsulating material with a thermal anneal of the layer of encapsulating material, plurality of semiconductor die, adhesive layer and support structure;
   wherein the step of removing the top portion comprises planarizing.

10. The method of claim 1 further comprising:
    removing the support structure and the adhesive layer;
    inverting the layer of encapsulating material and plurality of semiconductor die so that a portion of the layer of encapsulating material is below the plurality of semiconductor die;
    exposing electrical contacts to the plurality of semiconductor die; and
    completing formation of packaged semiconductor devices with additional structures formed overlying the plurality of semiconductor die.

11. A method comprising:
    providing a base;
    placing an adhesive tape overlying the base, the adhesive tape having a first adhesive surface in contact with the base and an opposite second adhesive surface;
    placing a plurality of semiconductor die on the second adhesive surface of the adhesive tape, the plurality of semiconductor die being laterally separated from each other and having electrical contacts that are in contact with the second adhesive surface of the adhesive layer;
    forming an encapsulant overlying and between the plurality of semiconductor die, the encapsulant having a distribution of filler material, a top portion, and a bottom portion;
    creating a high concentration region in all areas of the filler material that are laterally adjacent each of the plurality of semiconductor die so that the bottom portion has a higher concentration of filler material than the top portion, the high concentration region having at least eighty-five percent by weight of filler material; and
    removing the top portion.

12. The method of claim 11 further comprising:
    increasing a size of the high concentration region of the filler material to include a portion overlying the plurality of semiconductor die.

13. The method of claim 11 further comprising:
    increasing concentration of the filler material by applying vibrational energy to the workpiece, adhesive tape, plurality of semiconductor die and encapsulant.

14. The method of claim 11 further comprising:
    increasing concentration of the filler material by aligning the workpiece to be below the adhesive tape, plurality of semiconductor die and encapsulant to permit gravity to modify the concentration of the filler material.

15. The method of claim 11 further comprising:
    increasing concentration of the filler material by placing the workpiece, adhesive tape, plurality of semiconductor die and encapsulant in a vacuum to modify the concentration of the filler material.

16. The method of claim 11 further comprising:
    increasing concentration of the filler material by applying centrifugal energy to the workpiece, adhesive tape, plurality of semiconductor die and encapsulant.

17. The method of claim 11 further comprising:
    increasing concentration of the filler material by using a magnetic or charged filler material influenced by a magnetic or electric field.

18. The method of claim 11 wherein the encapsulant comprises a glob-type resin, the method further comprising:
    curing the encapsulant, plurality of semiconductor die, adhesive tape and workpiece with a thermal anneal;
    wherein the step of removing the first portion comprises planarizing.

* * * * *